United States Patent
Chen et al.

(10) Patent No.: US 8,369,093 B2
(45) Date of Patent: Feb. 5, 2013

(54) MOUNTING APPARATUS FOR EXPANSION CARD AND ELECTRONIC DEVICE USING THE SAME

(75) Inventors: Hsuan-Chang Chen, Taipei Hsien (TW); Chia-Ming Chang, Tu-Cheng (TW); Ping-Hung Chen, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 279 days.

(21) Appl. No.: 12/978,521

(22) Filed: Dec. 24, 2010

(65) Prior Publication Data

US 2012/0127649 A1    May 24, 2012

(30) Foreign Application Priority Data

Nov. 19, 2010   (TW) .............................. 99140084 A (51) Int. Cl.
*H05K 7/14*         (2006.01)
(52) U.S. Cl. ................ 361/732; 361/679.02; 312/223.2; 248/220.21
(58) Field of Classification Search ............. 361/679.32, 361/728, 730, 732; 312/223.2
See application file for complete search history.

(56) References Cited

U.S. PATENT DOCUMENTS

| | | | |
|---|---|---|---|
| 6,738,261 B2* | 5/2004 | Vier et al. ..................... | 361/740 |
| 7,110,253 B2* | 9/2006 | Fan ........................... | 361/679.32 |
| 7,326,077 B2* | 2/2008 | Shih et al. ..................... | 439/372 |
| 7,443,666 B2* | 10/2008 | Huang ..................... | 361/679.32 |
| 7,990,733 B2* | 8/2011 | Hsieh et al. ................... | 361/759 |
| 2004/0037048 A1* | 2/2004 | Liao .............................. | 361/726 |
| 2007/0030631 A1* | 2/2007 | Liang et al. ................... | 361/600 |

* cited by examiner

*Primary Examiner* — William Mayo, III
*Assistant Examiner* — Hiram E Gonzalez
(74) *Attorney, Agent, or Firm* — Altis Law Group, Inc.

(57) ABSTRACT

A mounting apparatus for mounting an expansion card to an electronic device includes a panel, a fixing bracket, and two locking members. The panel includes a rectangular plate and a frame. The fixing bracket is pivotably secured to the frame. The fixing bracket includes a contact portion and two pivot portions. The contact portion includes a first latching plate and a second latching plate. The first latching plate and the second latching plate cooperatively define a receiving space therebetween. Each of the two pivot portions includes a main plate, a stop plate, and a resilient portion. The two locking members are received in the two pivot portions. The top surface and a block plate of the expansion card are received in the receiving space.

20 Claims, 7 Drawing Sheets

MOUNTING APPARATUS FOR EXPANSION CARD AND ELECTRONIC DEVICE USING THE SAME

BACKGROUND

1. Technical Field

The present disclosure relates to device mounting, and particularly, to an expansion card mounting apparatus for an electronic device.

2. Description of Related Art

Computer systems typically require or include expansion cards providing additional or extended functionality. A frequently used expansion card includes a main body electrically connectable with a motherboard in a computer system, and a generally L-shaped block plate installable on a rear plate of the computer system. The block plate is typically attached on the rear plate with a screw. However, attaching the block plate with screws is unduly complicated and time-consuming, particularly when several expansion cards need to be fixed to the rear panel. In addition, a tool is usually required for installation and removal of the screw.

Therefore, a mounting apparatus is desired to overcome the limitations described.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Figure 1:
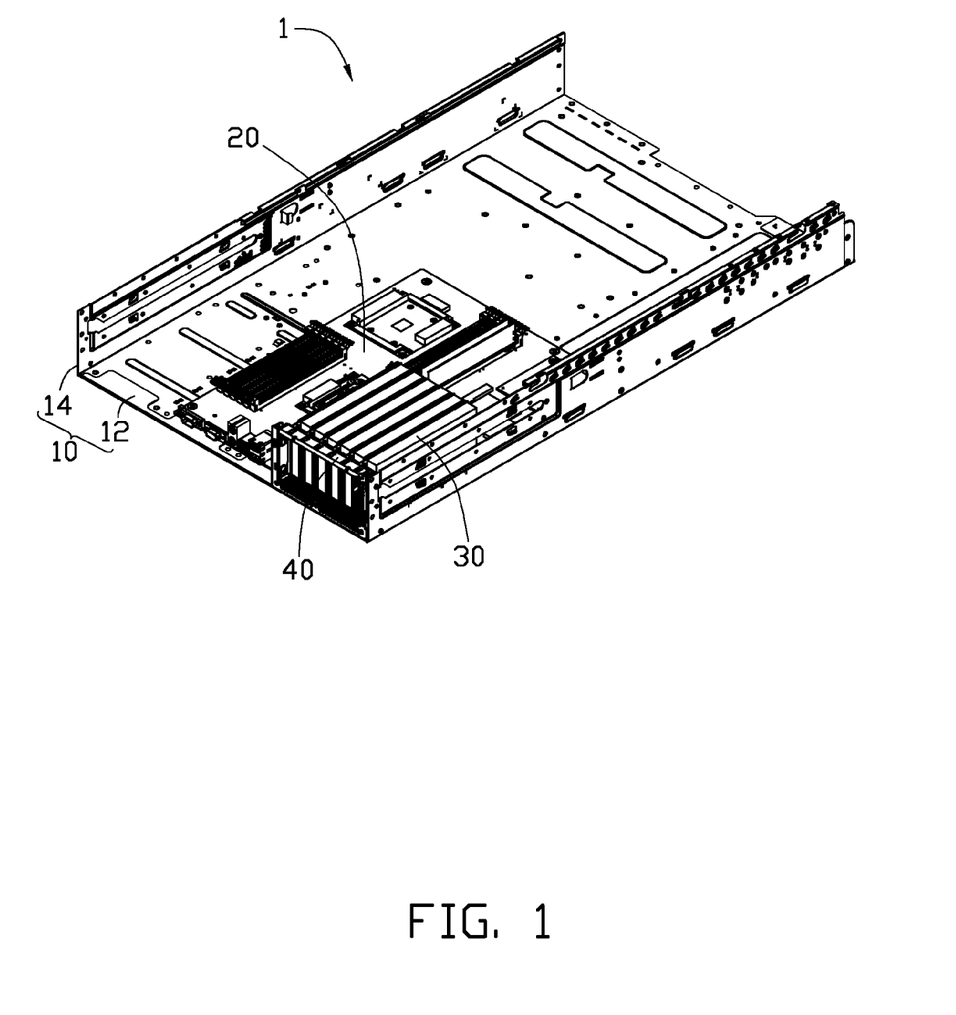
FIG. 1 is an assembled, isometric view of a mounting apparatus according to an exemplary embodiment applied with expansion cards, a motherboard, and a base.

Referring to FIG. 1, an exemplary embodiment of a mounting apparatus 40 is provided for mounting a plurality of expansion cards 30 to a motherboard 20 of a base 10 of an electronic device 1, such as a server.

The base 10 includes a bottom plate 12, and two side plates 14 extending up from two opposite edges of the bottom plate 12.

Figure 2:
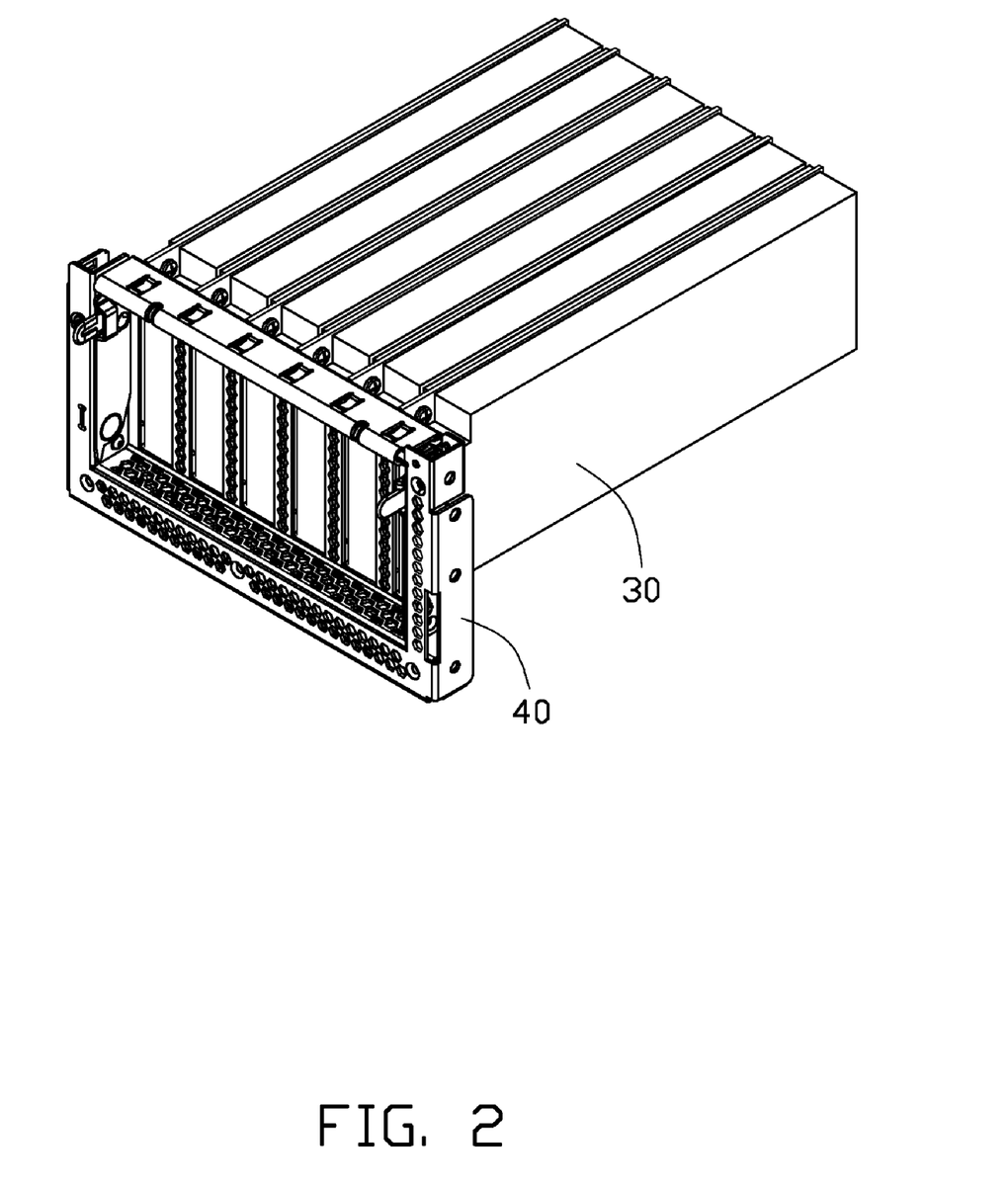
FIG. 2 is an enlarged view of the mounting apparatus and the expansion cards of FIG. 1.
Figure 3:
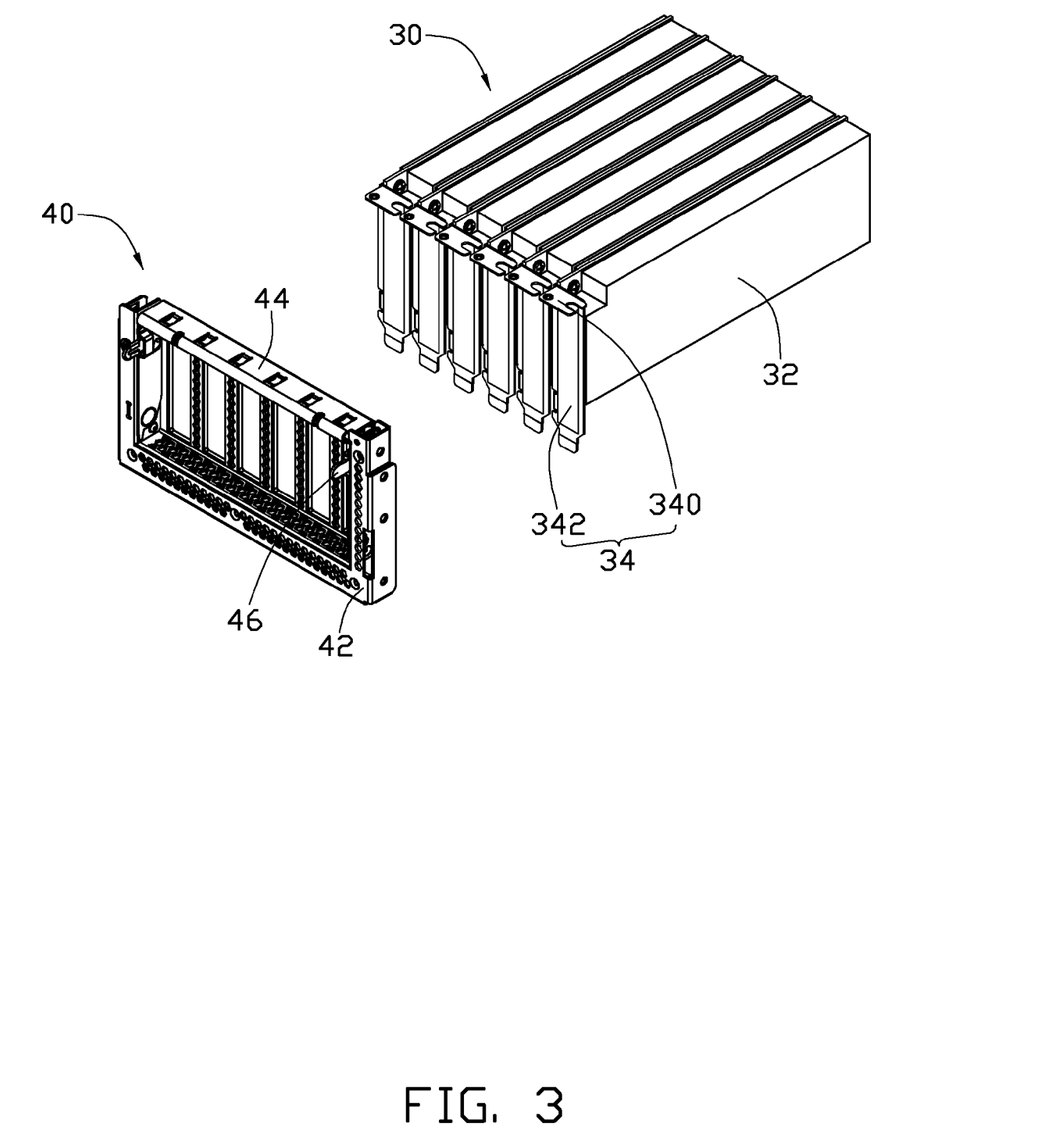
FIG. 3 is an exploded, isometric view of FIG. 2.

Referring to FIGS. 2-3, each of the plurality of expansion cards 30 includes a main body 32 perpendicularly mounted to the motherboard 20 inside the electronic device 1, and an L-shaped block plate 34 fixed to an end of the main body 32. The block plate 34 includes a first positioning plate 340 and a second positioning plate 342, and the first positioning plate 340 is angled from a top end of the second positioning plate 342 to form the L-shape.

Referring to FIGS. 4-7, the mounting apparatus 40 includes a rear panel 42 at an end the base 10, a fixing bracket 44, and two locking members 46. The rear panel 42 includes a rectangular rear plate 48 and a frame 50 extending from the rear plate 48. The rear plate 48 includes a plurality of elongated card slots 480 defined therein, each corresponding to the shape of a back plate of each of the plurality of expansion cards 30, such as that of the block plate 34. The frame 50 includes a bottom surface 52, two sidewalls 54 extending from two edges of the bottom surface 52, and a top surface 56. The bottom surface 52 includes a plurality of honeycomb holes defined therein. Each of the two sidewalls 54 includes a first through hole 540 defined therein, a protrusion 542 protruding from an inner side thereof, and two recesses 544 defined therein. The first through hole 540 and the protrusion 542 are positioned close to the bottom surface 52, and the two recesses 544 are positioned away from the bottom surface 52.

Figure 4:
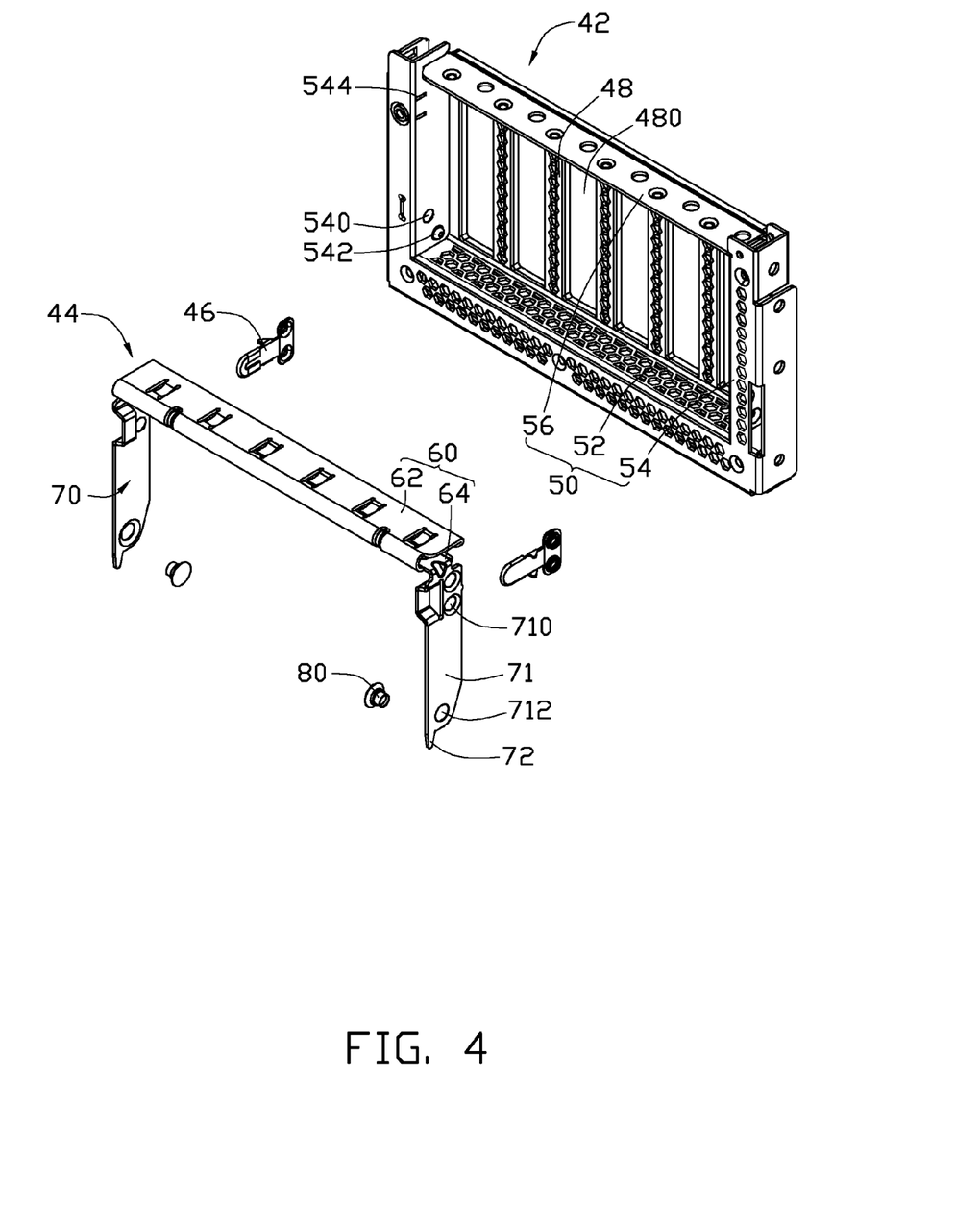
FIG. 4 is an exploded, isometric view of the mounting apparatus of FIG. 2, the mounting apparatus including a rear panel, a fixing bracket, and two locking members.
Figure 5:
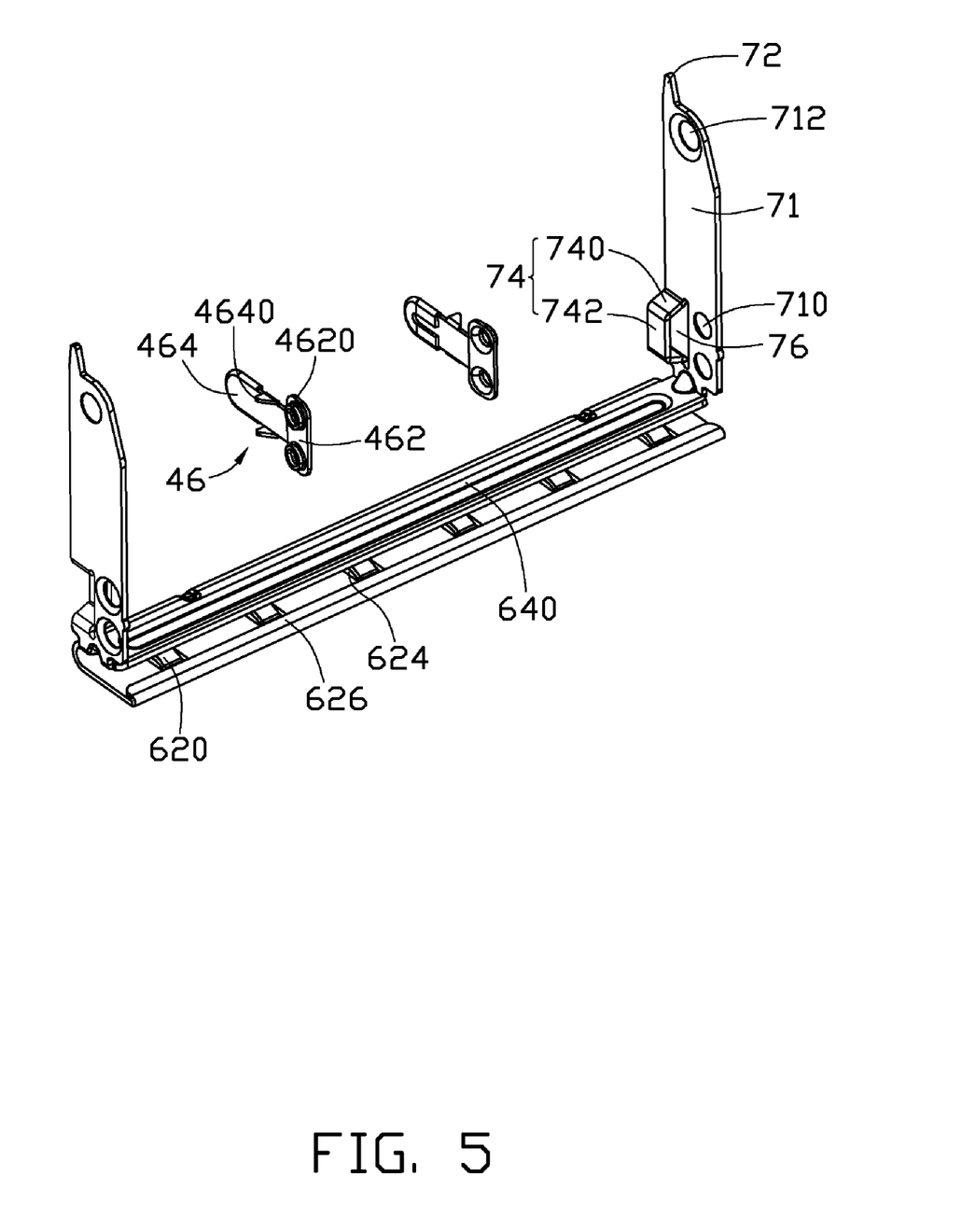
FIG. 5 is an exploded, isometric view of the fixing bracket and the two locking members of FIG. 4, but viewed from another aspect.

The fixing bracket 44 is U-shaped and includes a contact portion 60, and two pivot portions 70 extending from two ends of the contact portion 60. A cross section of the contact portion 60 is U-shaped. The contact portion 60 includes a first latching plate 62, and a second latching plate 64 extending inward from one side of the first latching plate 62. The second latching plate 64 is substantially parallel to the first latching plate 62. The first latching plate 62 and the second latching plate 64 cooperatively define a receiving space 65 therebetween. The first latching plate 62 includes a plurality of first raised portions 620 fixed thereon toward the second latching plate 64, two slits 624 defined in two sides of each of the plurality of first raised portions 620, and a curved portion 626 extending inward from the other side of the first latching plate 62. The plurality of first raised portions 620 is separated by a distance. The second latching plate 64 includes a second raised portion 640 fixed thereon toward the first latching plate 62.

Each of the two pivot portions 70 includes a main plate 71, a stop plate 72 extending from an end of the main plate 71 away from the second latching plate 64, and a resilient portion 74 fixed on an inner side of the main plate 71. The resilient portion 74 is U-shaped and includes a connection plate 742 and two support plates 740 extending from two ends of the connection plate 742. The connection plate 742 and the two support plates 740 cooperatively define an opening 76 for receiving each of the two locking members 46 therein. The main plate 71 includes two fixing holes 710 defined therein adjacent to the resilient portion 74, and a second through hole 712 defined therein adjacent to the stop plate 72.

Each of the two locking members 46 is T-shaped and includes a first locking plate 462 and a second locking plate 464. The first locking plate 462 includes two rivets 4620 fixed thereon, corresponding to the two fixing holes 710. The second locking plate 464 includes two locking tabs 4640 fixed on two sides of the second locking plate 464. An extension direction of the two rivets 4620 is same as an extension direction of the two locking tabs 4640.

During assembly of the two locking members 46 to the two pivot portions 70, the second locking plate 464 of each of the two locking members 46 is received in the opening 76 of each of the two pivot portions 70. The two locking members 46 and the two pivot portions 70 can be secured to each other by the two rivets 4620 of the first locking plate 462 passing through the two fixing holes 710 of the main plate 71.

Figure 6:
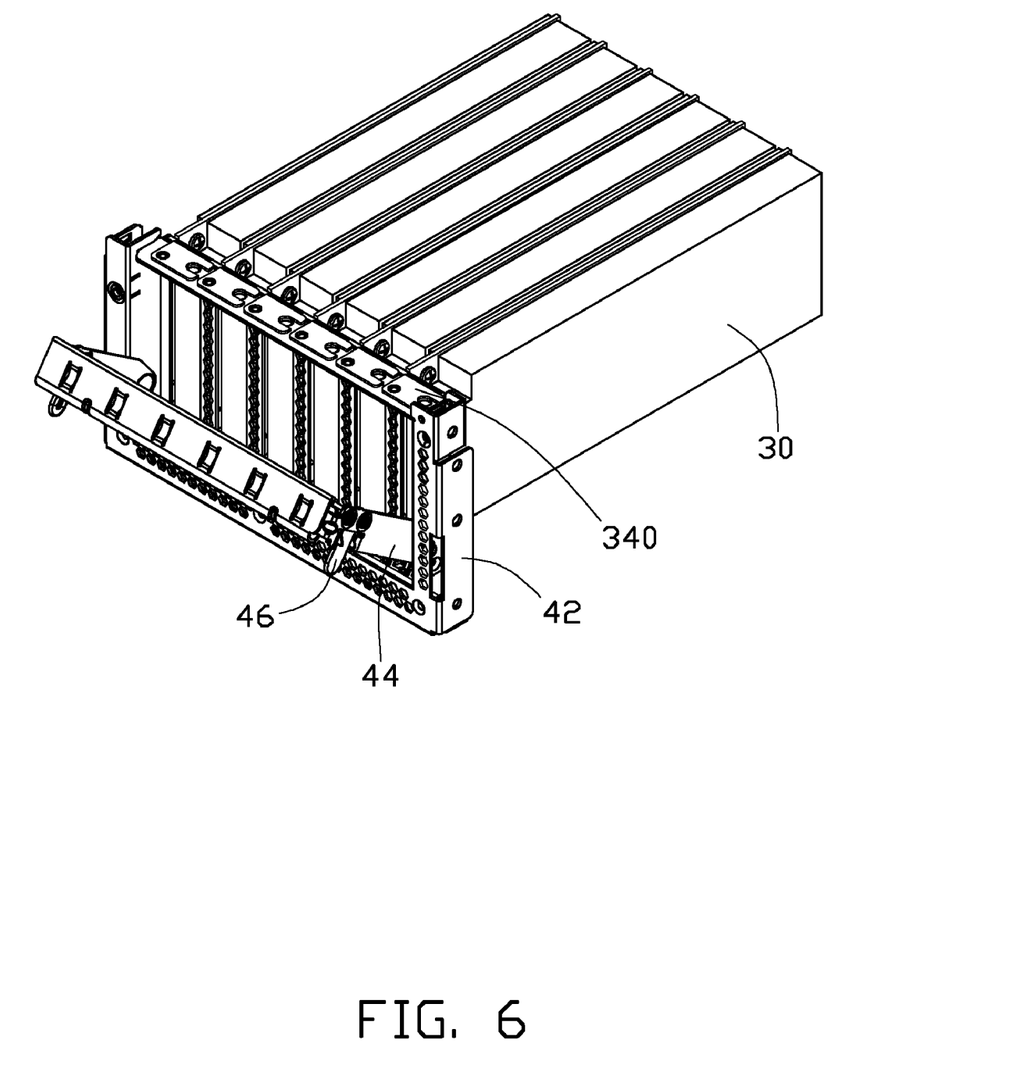
FIG. 6 is an assembled, isometric view of FIG. 3, showing an assembled mounting apparatus in a preparation state and the expansion cards.
Figure 7:
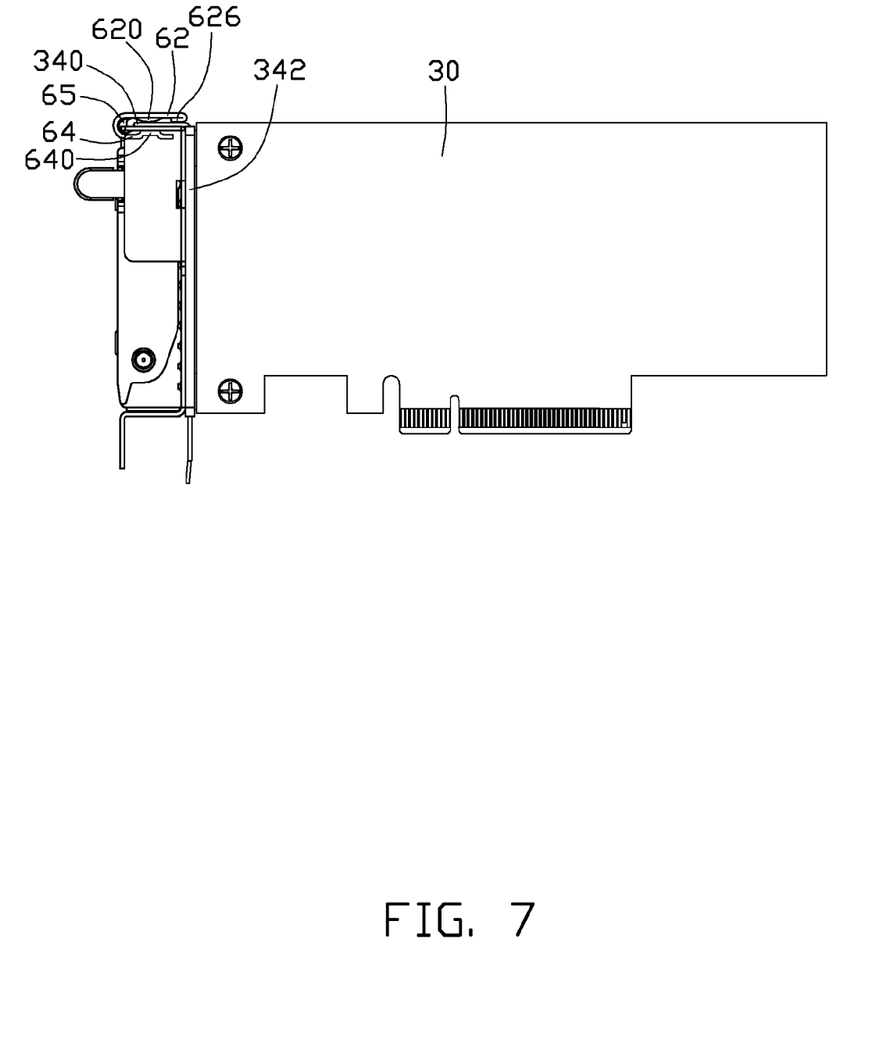
FIG. 7 is a schematic side view of FIG. 2.

During assembly of the fixing bracket 44 to the frame 50, the second through hole 712 of each of the two pivot portions 70 is aligned with the first through hole 540 of each of the two sidewalls 54, then the fixing bracket 44 and the frame 50 can be pivotably secured to each other by each of two fasteners 80 passing through the second through hole 712 and the first through hole 540. The main body 32 of each of the expansion cards 30 is then mounted to the motherboard 20. The first positioning plate 340 of the block plate 34 of each of the expansion cards 30 abuts the top surface 56 of the frame 50, and the second positioning plate 342 of the block plate 34 of each of the expansion cards 30 is aligned with the card slots 480. The top surface 56 and the second positioning plate 342 are received in the receiving space 65 of the fixing bracket 44 by upward rotation of the fixing bracket 44. Thus, the plurality of first raised portions 620 and the curved portion 626 abut the first positioning plate 340, the second raised portion 640 abuts the top surface 56, and the two locking tabs 4640 are received in the two recesses 544.

During removal of the expansion cards 30, the second locking plate 464 is operated to deform each of the two locking members 46 to disengage the two locking tabs 4640 from the two recesses 544. Then the fixing bracket 44 is withdrawn from the rear panel 42. Thus the expansion cards 30 can be removed from the motherboard 20. During downward rotation of the fixing bracket 44, the stop plate 72 abuts the protrusion 542 to limit the passage of the fixing bracket 44 through the rear panel 42.

While the disclosure has been described by way of example and in terms of preferred embodiment, it is to be understood that the disclosure is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A mounting apparatus for mounting an expansion card to an electronic device, the mounting apparatus comprising:
   a panel comprising a rectangular plate and a frame extending from the rectangular plate, wherein the frame comprises a bottom surface, two sidewalls extending from two edges of the bottom surface, and a top surface;
   a fixing bracket pivotably secured to the frame of the panel and comprising:
      a contact portion comprising a first latching plate, and a second latching plate extending inward from one side of the first latching plate, wherein the first latching plate comprises a plurality of first raised portions fixed thereon toward the second latching plate, and a curved portion extending inward from another side of the first latching plate, opposite to the end where the second latching plate extends; and wherein the first latching plate and the second latching plate cooperatively define a receiving space therebetween; wherein the second latching plate comprises a second raised portion fixed thereon toward the first latching plate; and
      two pivot portions extending from two ends of the contact portion, wherein each of the two pivot portions comprises a main plate, a stop plate extending from an end of the main plate away from the second latching plate, and a resilient portion fixed on an inner side of the main plate; and
   two locking members received in the two pivot portions;
   wherein the top surface and a block plate of the expansion card are received in the receiving space of the fixing bracket, the plurality of first raised portions and the curved portion abut the block plate, the second raised portion abuts the top surface, thereby mounting the expansion card to the electronic device.

2. The mounting apparatus of claim 1, wherein the rectangular plate comprises a plurality of elongated card slots defined therein, corresponding to the block plate.

3. The mounting apparatus of claim 2, wherein the bottom surface comprises a plurality of honeycomb holes defined therein, and wherein each of the two sidewalls comprises a first through hole defined therein, a protrusion protruding from an inner side thereof, and two recesses defined therein.

4. The mounting apparatus of claim 3, wherein the fixing bracket is U-shaped, and a cross section of the contact portion is U-shaped.

5. The mounting apparatus of claim 4, wherein the resilient portion is U-shaped and comprises a connection plate and two support plates extending from two ends of the connection plate, and wherein the connection plate and the two support plates cooperatively define an opening for receiving each of the two locking members therein.

6. The mounting apparatus of claim 5, wherein the main plate comprises two fixing holes defined therein adjacent to the resilient portion for fixing each of the two locking members, and a second through hole defined therein adjacent to the stop plate.

7. The mounting apparatus of claim 6, wherein each of the two locking members is T-shaped and comprises a first locking plate and a second locking plate, and wherein the first locking plate comprises two rivets fixed thereon, the second locking plate comprises two locking tabs fixed on two sides of the second locking plate.

8. The mounting apparatus of claim 7, wherein the two rivets of the first locking plate passing through the two fixing holes of the main plate, thereby mounting the two locking members to the two pivot portions.

9. The mounting apparatus of claim 8, wherein the mounting apparatus further comprises two fasteners, and wherein each of the two fasteners passing through the second through hole and the first through hole, thereby pivotably mounting the fixing bracket to the frame.

10. The mounting apparatus of claim 1, wherein the plurality of first raised portions is separated by a distance.

11. An electronic device comprising:
   a motherboard;
   a plurality of expansion cards mounted to the motherboard and each comprising: a main body; and an L-shaped block plate fixed to an end of the main body, wherein the block plate comprises a second positioning plate, and a first positioning plate angled from a top end of the second positioning plate; and
   a mounting apparatus for mounting the expansion cards to the electronic device, the mounting apparatus comprising:
      a rear panel comprising a rectangular rear plate and a frame extending from the rear plate, wherein the frame comprises a bottom surface, two sidewalls extending from two edges of the bottom surface, and a top surface;
      a fixing bracket pivotably secured to the frame of the rear panel and comprising:
         a contact portion comprising a first latching plate, and a second latching plate extending inward from one side of the first latching plate, wherein the first latching plate comprises a plurality of first raised portions fixed thereon toward the second latching plate, and a curved portion extending inward from another side of the first latching plate, opposite to the end where the second latching plate extends;

and wherein the first latching plate and the second latching plate cooperatively define a receiving space therebetween; wherein the second latching plate comprises a second raised portion fixed thereon; and two pivot portions extending from two ends of the contact portion, wherein each of the two pivot portions comprises a main plate, a stop plate extending from an end of the main plate away from the second latching plate, and a resilient portion fixed on an inner side of the main plate, and two locking members received in the two pivot portions;

wherein the top surface and the second positioning plate of the block plate are received in the receiving space of the fixing bracket, the plurality of first raised portions and the curved portion abut the first positioning plate, the second raised portion abuts the top surface, thereby mounting the expansion card to the electronic device.

12. The electronic device of claim 11, wherein the rear plate comprises a plurality of elongated card slots defined therein, corresponding to the block plate.

13. The electronic device of claim 12, wherein the bottom surface comprises a plurality of honeycomb holes defined therein, and wherein each of the two sidewalls comprises a first through hole defined therein, a protrusion protruding from an inner side thereof, and two recesses defined therein.

14. The electronic device of claim 13, wherein the fixing bracket is U-shaped, and a cross section of the contact portion is U-shaped.

15. The electronic device of claim 14, wherein the resilient portion is U-shaped and comprises a connection plate and two support plates extending from two ends of the connection plate, and wherein the connection plate and the two support plates cooperatively define an opening for receiving each of the two locking members therein.

16. The electronic device of claim 15, wherein the main plate comprises two fixing holes defined therein adjacent to the resilient portion for fixing each of the two locking members, and a second through hole defined therein adjacent to the stop plate.

17. The electronic device of claim 16, wherein each of the two locking members is T-shaped and comprises a first locking plate and a second locking plate, and wherein the first locking plate comprises two rivets fixed thereon, the second locking plate comprises two locking tabs fixed on two sides of the second locking plate.

18. The electronic device of claim 17, wherein the two rivets of the first locking plate passing through the two fixing holes of the main plate, thereby mounting the two locking members to the two pivot portions.

19. The electronic device of claim 18, wherein the mounting apparatus further comprises two fasteners, and wherein each of the two fasteners passing through the second through hole and the first through hole, thereby pivotably mounting the fixing bracket to the frame.

20. The electronic device of claim 11, wherein the plurality of first raised portions is separated by a distance.

\* \* \* \* \*